(12) United States Patent
Strutt et al.

(10) Patent No.: US 9,685,942 B2
(45) Date of Patent: Jun. 20, 2017

(54) CIRCUIT ARRANGEMENT FOR THE PROTECTION OF AT LEAST ONE COMPONENT OF A TWO WIRE ELECTRICAL CURRENT LOOP

(71) Applicant: Endress + Hauser GmbH + Co. KG, Maulburg (DE)

(72) Inventors: Bernd Strutt, Steinen (DE); Jurgen Meier, Maulburg (DE); Christoph Schleith, Schopfheim (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 0 days.

(21) Appl. No.: 14/901,181

(22) PCT Filed: Jun. 2, 2014

(86) PCT No.: PCT/EP2014/061361
§ 371 (c)(1),
(2) Date: Dec. 28, 2015

(87) PCT Pub. No.: WO2015/000650
PCT Pub. Date: Jan. 8, 2015

(65) Prior Publication Data
US 2016/0164511 A1    Jun. 9, 2016

(30) Foreign Application Priority Data

Jul. 5, 2013   (DE) .................. 10 2013 107 088

(51) Int. Cl.
*H03K 17/687* (2006.01)
*H03K 17/082* (2006.01)
*H03K 17/74* (2006.01)

(52) U.S. Cl.
CPC ..... *H03K 17/0822* (2013.01); *H03K 17/6877* (2013.01); *H03K 17/74* (2013.01)

(58) Field of Classification Search
USPC ................................ 327/365–508
See application file for complete search history.

(56) References Cited

U.S. PATENT DOCUMENTS

| 4,757,341 A | 7/1988 | Tanigawa |
| 4,855,666 A | 8/1989 | Jones |
| (Continued) | | |

FOREIGN PATENT DOCUMENTS

| DE | 2545919 A1 | 4/1977 |
| DE | 3703776 A1 | 8/1987 |
| (Continued) | | |

OTHER PUBLICATIONS

German Search Report, German PTO, Munich, DE, Dec. 18, 2013.
(Continued)

*Primary Examiner* — Brandon S Cole
(74) *Attorney, Agent, or Firm* — Bacon & Thomas, PLLC

(57) ABSTRACT

A circuit arrangement for the protection of at least one component of a two wire electrical current loop, which is connected in series with a burden to an AC/DC electrical current source. The two wire electrical current loop has a rectifier a clock signal producer and a switch. The rectifier forms a DC circuit, wherein the component is connected in the DC circuit and wherein the clock signal producer outputs a clock signal to the switch for clocking the DC circuit. The circuit arrangement has a diode, wherein the conduction direction of the diode points from the anode of the diode to the cathode of the diode. The cathode of the diode is connected to the DC circuit, and the anode of the diode is supplied with a periodic or constant voltage from a first voltage source, and the voltage is at least periodically greater than a predetermined threshold value.

10 Claims, 4 Drawing Sheets

(56) References Cited

U.S. PATENT DOCUMENTS

| | | | |
|---|---|---|---|
| 5,467,242 A | 11/1995 | Kiraly | |
| 6,433,981 B1 | 8/2002 | Fletcher | |
| 6,809,571 B2 | 10/2004 | Grasso | |
| 8,810,160 B2* | 8/2014 | Hoogzaad | H05B 33/0818 315/224 |
| 2002/0125869 A1* | 9/2002 | Groom | H02M 3/1584 323/283 |
| 2006/0239040 A1* | 10/2006 | Fukumoto | H02M 3/33507 363/21.01 |
| 2007/0138972 A1* | 6/2007 | Siessegger | H05B 41/2881 315/225 |
| 2007/0182459 A1* | 8/2007 | Rees | H02M 1/08 327/78 |
| 2009/0273292 A1* | 11/2009 | Zimmermann | H05B 33/0818 315/209 R |
| 2013/0249515 A1* | 9/2013 | Mueller | H02M 3/33576 323/282 |
| 2013/0285734 A1* | 10/2013 | Nascimento | H03K 17/04123 327/396 |

FOREIGN PATENT DOCUMENTS

| | | |
|---|---|---|
| DE | 4320021 A1 | 12/1993 |
| DE | 10125210 A1 | 1/2003 |
| DE | 10297301 T5 | 9/2004 |
| EP | 0361212 B1 | 4/1990 |
| EP | 1113571 A2 | 7/2001 |
| WO | 8603079 A1 | 5/1986 |

OTHER PUBLICATIONS

International Search Report, EPO, The Netherlands, Sep. 3, 2014.

English Translation of the International Preliminary Report on Patentability, WIPO, Geneva, CH, Jan. 14, 2016.

* cited by examiner

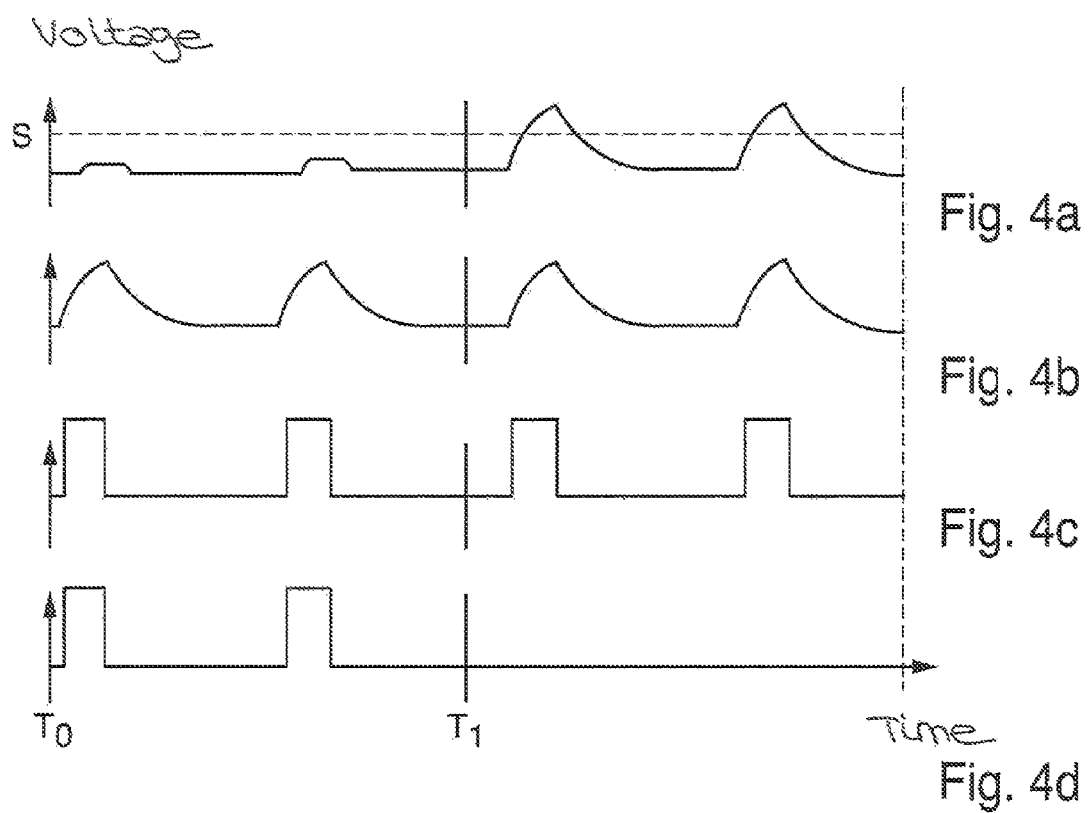

CIRCUIT ARRANGEMENT FOR THE PROTECTION OF AT LEAST ONE COMPONENT OF A TWO WIRE ELECTRICAL CURRENT LOOP

TECHNICAL FIELD

The invention relates to a circuit arrangement for the protection of at least one component of a two wire electrical current loop, which is connected in series with a burden to an AC/DC electrical current source, wherein the two wire electrical current loop has a rectifier, a clock signal producer and a switch, wherein the rectifier forms a DC circuit, wherein the switch is connected in the DC circuit and wherein the clock signal producer outputs a clock signal to the switch for clocking the DC circuit.

BACKGROUND DISCUSSION

Two wire electrical current loops are frequently applied in field devices of process- and automation technology. In process technology as well as in automation technology, field devices are often applied, which serve for registering and/or influencing process variables. Serving for registering process variables are measuring devices, such as, for example, fill level measuring devices, flow measuring devices, pressure- and temperature measuring devices, pH-measuring devices, conductivity measuring devices, etc., which register the corresponding process variables, fill level, flow, pressure, temperature, pH-value, and conductivity, respectively. Used for influencing process variables are actuators, such as valves or pumps, via which e.g. the flow of a liquid in a pipeline or the fill level of a medium in a container is changed. Referred to as field devices are, in principle, all devices, which are applied near to the process and deliver, or process, process relevant information. A large number of such field devices are manufactured and sold by members of the firm, Endress+Hauser. In connection with the invention, the terminology, field device, thus, encompasses all types of measuring devices and actuators. Furthermore, the concept, field device, includes also e.g. a gateway, a radio adapter or other bus participants integrated/integrable in a bus system.

If such a field device with two wire electrical current loop stops working, the resulting damage can be significant. It is, consequently, important, to provide a field device, which is secured against failure. Especially, a two wire electrical current loop must be secured against an arising overcurrent.

There are a number of possibilities for how an overcurrent can arise in the case of a two wire electrical current loop. Thus, there are many applications, in the case of which a two wire electrical current loop in series with a burden is connected to an electrical current supply. The burden is, for example, a contactor. In the case of start-up, respectively while the electrical current supply is connected, it can occur that the burden is forgotten and is not connected. It is further possible that a short circuit occurs across the burden. In these cases, there is no voltage drop across the burden. In case a component is connected in series with the burden, the voltage drop across this component is higher than in normal operation, in the case of which no overcurrent state is present. The component can be, for example, a switch. If the component is sensitive to too high electrical current, the component can be damaged in the case of occurrence of an excessive electrical current. For example, FETs (field effect transistors) are applied increasingly as switches in two wire electrical current loops. When a FET is applied as switch and an overcurrent state occurs, the FET will suffer irreparable damage within a short time.

Circuit arrangements for the protection of components of a two wire electrical current loop are known. Thus, published international application, WO 86/03079 discloses a circuit arrangement for switching ohmic and inductive electrical consumers in direct and alternating current circuits. The circuit arrangement includes a control electronics as well as a voltage supply serving for supplying the control electronics and a short circuit- and overload protection. Provided in the circuit arrangement are means for detecting overload states, for example, as a result of an unallowably high temperature of the transistor or an unallowably high load current. In the case of an overload state, the switch is supplied with a control signal. The means for detecting an overload state comprises an electrical current measuring resistor, through which the load current flows, as well as a threshold switch.

Known from German patent, DE 39 24 824 A1 is a circuit arrangement with a control circuit for the protection of a clocked semiconductor switch lying with its switch path in a load current circuit. The circuit arrangement includes an actual value sensor, which forms an actual value of the load current flowing in the switch path of the semiconductor switch. The clocked activating of the semiconductor switch occurs via the control circuit. Lying in series with the switch path of the semiconductor switch is a measuring resistor. The voltage drop occurring across the measuring resistor represents the input variable of the actual value sensor. The actual value sensor includes a first diode, whose cathode is connected with the input of the actual value sensor, a second diode, whose cathode is connected with the anode of the first diode and whose anode is connected both via a first resistor with the output of the actual value sensor as well as also via a second resistor with a first operating voltage source. The output of the control unit is connected with the input of a Schmitt-trigger, the output of the Schmitt-trigger is connected with the input of the control circuit, and the output of the control circuit controls the gate electrode of the field effect transistor.

Known from German patent, DE 101 25 210 B4 is a circuit arrangement for feeding a load by means of a thyristor. The load is connected with an input of a rectifier circuit. The anode cathode path of the thyristor is coupled with the plus and minus outputs of the rectifier circuit and protected against short circuits of the load. For this, the plus output is connected via a transistor and a diode with one side and the minus output with the other side of a capacitor as circuit zero point (circuit ground). The transistor and the resistor are connected in parallel with the thyristor. The junction of transistor and resistor lies on the one input of a comparator; while a reference voltage lies on the other input. In the case of a short circuit of the load, the switching voltage of the measurement transmitter is disconnected from the gate of the thyristor by means of the switch.

All these solutions have a kind of measuring resistor, which is connected downstream from a switch or component, which is to be protected from the circuit arrangement. However, associated with such are certain disadvantages. Because the measuring resistors are connected in series with the switch, there is a continuous energy loss in the case of normal operation. Furthermore, the measuring resistors can be damaged in the case of an overcurrent state, for example, by overheating.

SUMMARY OF THE INVENTION

An object of the invention is to provide a circuit arrangement, which protects a component of a two wire electrical current loop in an energy efficient manner in the case an overload electrical current state.

The object is achieved by features including that the circuit arrangement has a diode, wherein the conduction direction of the diode points from the anode of the diode to the cathode of the diode, that the cathode of the diode is connected to the DC circuit, that the anode of the diode is supplied with a periodic or constant voltage from a first voltage source, that the voltage is at least periodically greater than a predetermined threshold value, and that the circuit arrangement has at least one switch element, which serves to turn the clock signal on or off, wherein the switch element passes or blocks the clock signal as a function of the result of a comparison between the voltage, which the anode of the diode has, and the threshold value.

If the switch element passes the clock signal, the clock signal arrives at the switch, and the electrical current of the DC circuit can flow in clocked pulses. Thus, the electrical current supply of the field device is enabled in normal operation. During an overload electrical current state, the switch element blocks the clock signal. Thus, no electrical current can flow in the DC circuit, and the switch is protected from a too high electrical current.

A preferred embodiment provides that the first voltage source is embodied as a clock signal producer. In such case, the voltage, with which the anode of the diode is supplied, is at least periodically greater than the predetermined threshold value. The clock signal producer serves, in this case, to fulfill a number of tasks: The manufacturing costs are lower than otherwise, and no additional voltage supply is required. Thus, a compact device construction is possible.

In the case of an advantageous further development of the example of an embodiment, the anode of the diode is connected to a first input of a comparator and an adjustable second voltage source is connected to a second input of the comparator. The comparator provides a simple comparison between the voltage, which is on the anode of the diode, and the threshold value, wherein the threshold value is provided here by the adjustable second voltage source.

In the case of an advantageous further development of the circuit arrangement of the invention, the adjustable second voltage source includes a voltage divider. The voltage divider serves as a cost effective means for setting the above mentioned threshold value, without mentionable influencing of the energy consumption or the reliability of the field device.

In the case of an advantageous further development of the circuit arrangement of the invention, an output of the comparator is connected with the switch element, wherein the switch element is a logic element. A logic element, for example, a NAND gate, offers much flexibility in the case of the design of a field device, so that an optimal embodiment as regards specific goal setting is implementable. In a preferred embodiment, the field device can in the case a temporarily arising and correctable error function further by integrating a monoflop (i.e. a monostable multivibrator) into the logic element.

In an advantageous further development of the circuit arrangement of the invention, an output of the logic element is connected with a microcontroller, wherein the microcontroller detects based on an output signal of the logic element an overcurrent state in the DC circuit. If the microcontroller detects an overcurrent state, the microcontroller can function as second safety stage. A first safety stage in the sense the invention is the rapidly reacting hardware functioning of the switch element. The microcontroller can function as second safety stage, for example, by so controlling the circuit arrangement that the clock signal is switched off for good or that an error report is output.

In an advantageous further development of the circuit arrangement of the invention, a semiconductor switch is connected between the anode of the diode and ground, wherein the microcontroller so controls the semiconductor switch that the voltage on the first input of the comparator lies for a short time under the threshold value. If the semiconductor switch switches for a short time a path from the anode of the diode to ground, the voltage on the first input of the comparator is for a short time drawn down to reference ground. Since the ground potential lies under the threshold value, the clock signal is placed back on the switch. This procedure enables the further functioning of the field device in the case of a temporarily arising and correctable error, without that the field device must be manually restarted. Thus, time and/or maintenance costs are/is saved.

In an embodiment of the circuit arrangement of the invention, the clock signal producer is integrated into the microcontroller or embodied as a separate microcontroller unit. The microcontroller serves, in this case, to fulfill a number of tasks. Manufacturing costs are, in such case, kept lower than otherwise. Furthermore, a compact device construction is achieved, for example, in that the clock signal producer is driven directly by the microcontroller.

In an embodiment of the circuit arrangement of the invention, the clock signal lies via a filter element on the anode of the diode. The filter element serves for counteracting a time shift between the clock signal and the actual switching signal, which arrives at the switch. Were the diode to be reached faster than the switch, a voltage peak could arise, when the pulse already lies on the diode and the switch has still not switched.

In the case of an advantageous further development of the circuit arrangement of the invention, a feedback between the output of the comparator and the first input of the comparator is provided, wherein the feedback has a feedback diode, which serves to keep the voltage on the first input of the comparator above the threshold value. The cathode of the feedback diode is connected to the first input of the comparator. The anode of the feedback diode is connected to the output of the comparator and also to the second voltage source. When the feedback diode is so arranged, the voltage on the first input of the comparator remains above the threshold value and the switch element, respectively logic element, blocks the clock signal further.

BRIEF DESCRIPTION OF THE DRAWINGS

The invention will now be explained in greater detail based on the appended drawing, the figures of which show as follows:

FIGS. 4a-4d are schematic representations of the curve of the clock signal T in the form of voltage versus time for four sampling locations A, B, C, D of the circuit arrangement of the invention shown in FIG. 2.

DETAILED DISCUSSION IN CONJUNCTION WITH THE DRAWINGS

Figure 1:
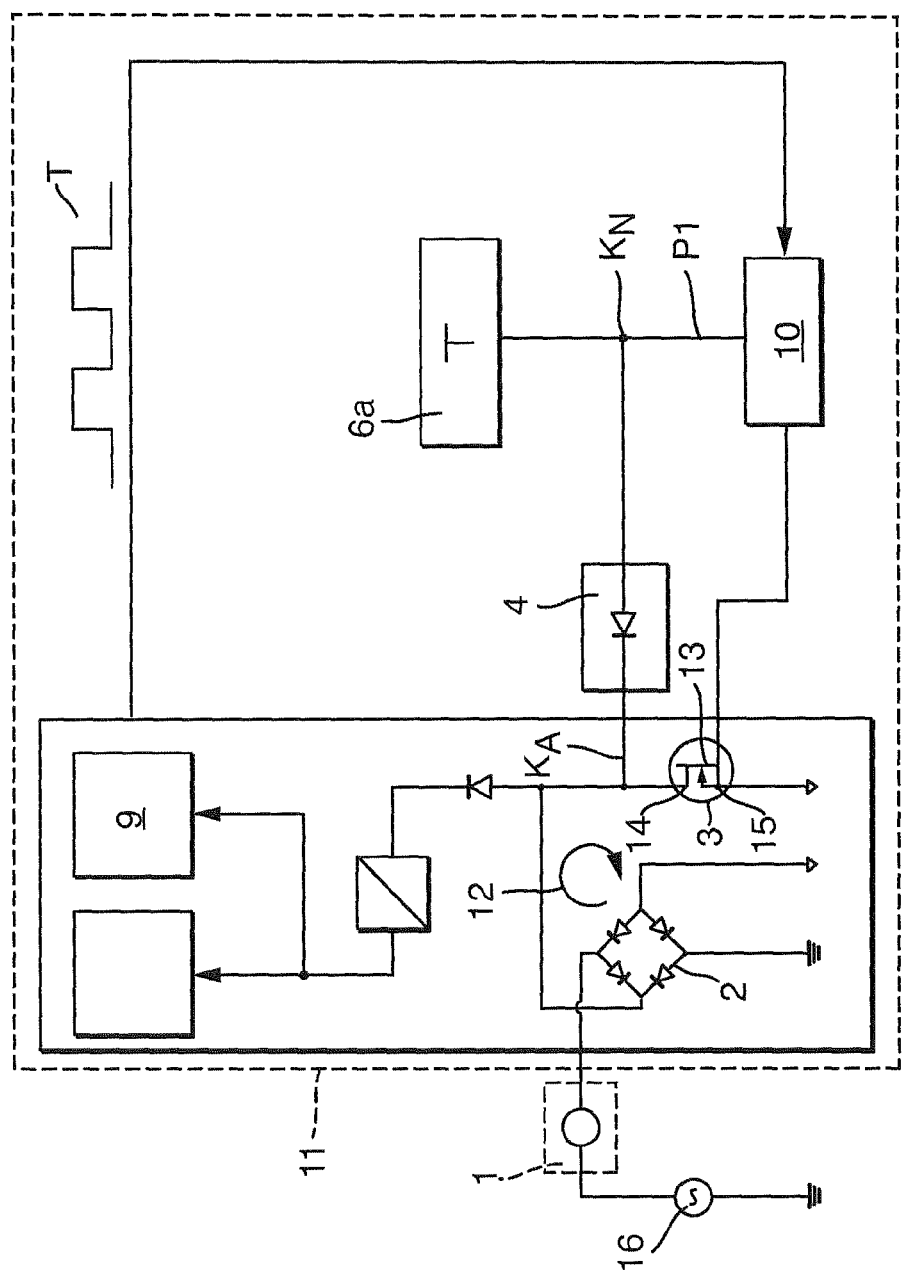
FIG. 1 is a block diagram of a first example of an embodiment of the circuit arrangement of the invention.

FIG. 1 shows a first example of an embodiment of the circuit arrangement of the invention in the form a block diagram. In such case, a two-wire measuring device 11 is connected to an AC/DC voltage source 16. The voltage source 16 has in the maximum case a voltage between 19 and 253 volt. Connected in series with the two-wire measuring device 11 between the AC/DC voltage source 16 and the measuring device 11 is a burden 1. The electrical current flow via the burden 1 into the measuring device 11 is rectified by a rectifier 2, wherein in this example the rectifier 2 is configured especially as a bridge rectifier. This configuration serves to feed a DC circuit 12, wherein the electrical current flowing in the DC circuit 12 flows via a switch 3. In this example of an embodiment, the switch 3 is a field effect transistor 3, wherein its drain 14 with reference to the electrical current flow direction is placed in front of the source 15. The gate 13 of the field effect transistor 3 is controlled by a microcontroller 9. Microcontroller 9 sends a clock signal T to the gate 13 of the field effect transistor 3, which effects that the electrical current of the DC circuit 12 flows in clocked pulses. Thus, an operating cycle is set and the measuring device 11 is fed with a predetermined power.

The clock signal T is fed to the gate 13 of the transistor 3 via a normally closed switch 10. A normally closed switch 10 in the sense the invention is a switch, which in the normal state can pass an incoming signal or voltage. The normally closed switch 10 in the normal state in FIG. 1 lets a clock signal T output by the microcontroller 9 pass through. Switch 3 is, thus, controlled by the microcontroller 9 by means of the clock signal T.

Connected to a point $K_A$ in the DC circuit 12, which with reference to the flow direction of the switch 3 is in front, is a diode 4. Diode 4 is so arranged that its cathode $K_A$ is connected to the DC circuit 12. The anode of diode 4 is connected to a node $K_N$ in the circuit arrangement. Connected to this node $K_N$ is a voltage source 6a, as well as a path P1 to the normally closed switch 10. Path P1 to the normally closed switch 10 serves for controlling the normally closed switch 10. For the case, in which the voltage on the node $K_N$, respectively on the path P1, remains under a predetermined threshold value S, the normally closed switch 10 remains in the normal state, and the clock signal T is passed through. If the voltage on the node $K_N$ and on the path P1 exceeds this threshold value S, then the normally closed switch 10 no longer lets the clock signal T pass through.

Voltage source 6a is so embodied that it outputs a constant voltage. This voltage is greater than the threshold value S, respectively the voltage, which is required, in order to bring the normally closed switch 10 out of its normal state.

In normal operation of the circuit arrangement, diode 4 and the voltage source 6a should have no influence on normal operation of the switch 3 and the DC circuit 12. In order to assure this, the normally closed switch 10 is so selected that the threshold value S lies higher than the conducting state voltage drop of the diode 4. As a rule, conducting state voltage drop of the diode 4 amounts to about 0.7 volt.

Due to the large ohmic resistance of the burden 1, there is in normal operation of the circuit arrangement a small voltage drop across the switch 3. Therefore, the diode 4 is conducting and the voltage on the node $K_N$ is limited by the conducting state voltage of the diode 4. Thus, the normally closed switch 10 is not brought out of the normal state.

As already earlier mentioned, an overcurrent occurs, when no burden 1 is present or when a short circuit arises across the burden 1. Independently of the cause of the excess electrical current, this overcurrent state effects that the switch 3 is supplied with a high voltage. When the switch 3 is supplied with a high voltage, diode 4 is non-conducting.

As a result of this, the voltage on the node $K_N$ is no longer limited by the conducting state voltage drop of the diode 4. Since the voltage source 6a supplies the node $K_N$ with a higher voltage than the threshold value S of the normally closed switch 10, the normally closed switch 10 is immediately switched, such that no clock signal T is passed. Switch 3 is, thus, immediately switched off and secured against damage, which could arise from the overcurrent.

Figure 2:
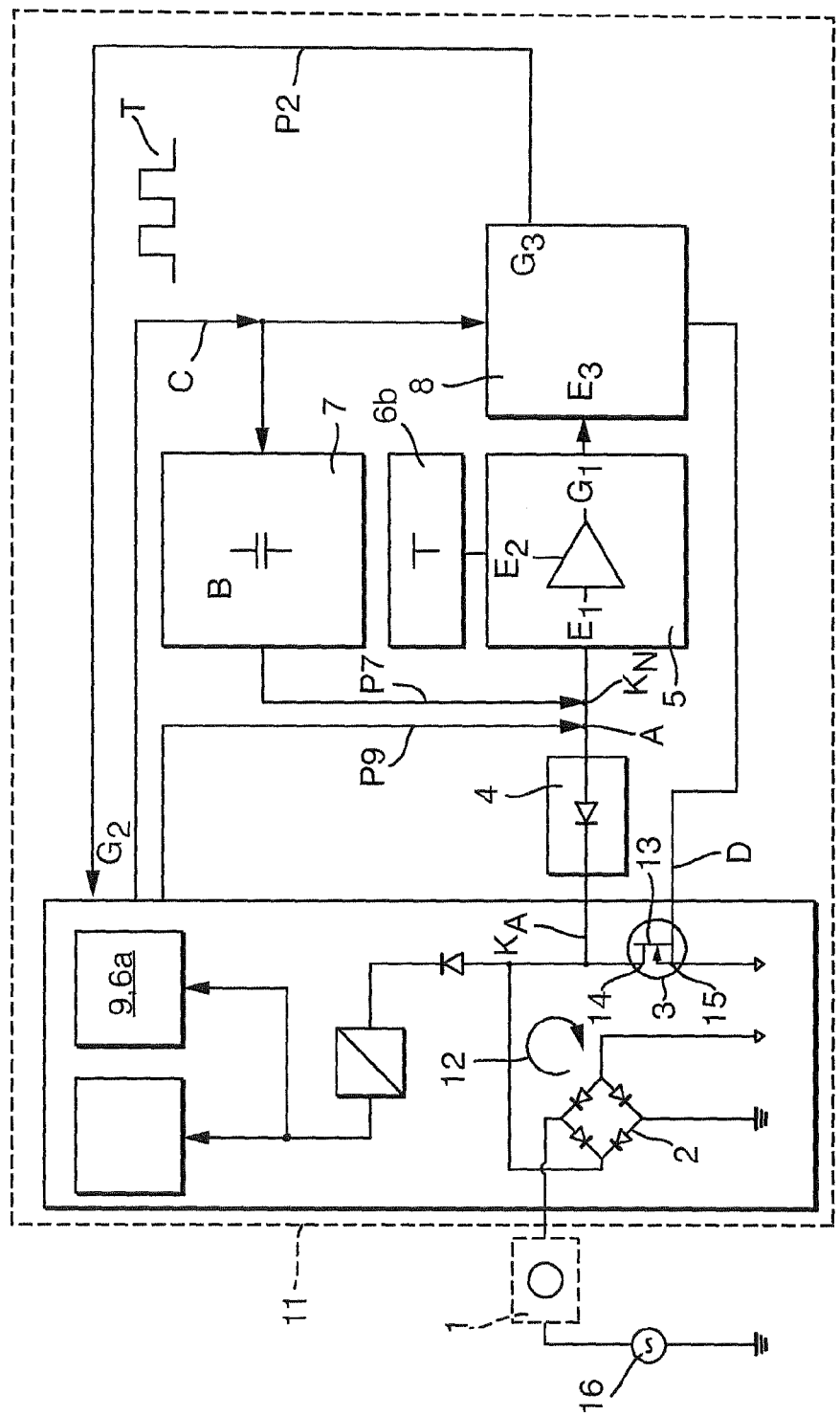
FIG. 2 is a block diagram of a second example of an embodiment of the circuit arrangement of the invention.

FIG. 2 shows a second example of an embodiment of the circuit arrangement of the invention in the form a block diagram, which has, same as the example of an embodiment shown in FIG. 1, a burden 1, a rectifier 2 and a switch 3, which is preferably a field effect transistor 3. As in FIG. 1, a clock signal T is produced by a microcontroller 9. In contrast to the example of an embodiment illustrated in FIG. 1, the clock signal T in FIG. 2 is fed to the gate 13 of the field effect transistor 3 not via a normally closed switch 10, but, instead, via a logic element 8, wherein the logic element 8 is preferably a NAND gate.

Furthermore, the advantageous example of an embodiment includes a diode 4, wherein the anode of the diode 4 is now connected to a first input E1 of a comparator 5. Comparator 5 has a second input E2, to which is supplied a predetermined threshold value S of a voltage source 6b.

Connected to the anode of the diode 4, respectively to the first input E1 of the comparator 5, are also two paths P7, P9. One of these two paths, path P7, leads to a filter element 7. Filter element 7 is connected with the output G2 of the microcontroller 9. Thus, the clock signal T produced by the microcontroller 9 is fed to the filter element 7. The voltage across the filter element 7 is, consequently, controlled by the clock signal T.

There is, additionally, a path P9 between the microcontroller 9 and the anode of the diode 4, respectively the first input E1 of the comparator 5. Path P9 in FIG. 2 can be referred to as "reset short circuit".

An output G1 of the comparator 5 is connected with the logic element 8. Output G1 has a voltage, which depends on a state of the comparator 5, wherein the state of the comparator 5 is either high or low. If is the comparator 5 in the low state, its output G1 has a low voltage, for example, no voltage. If the comparator 5 is located in the high state, the output G1 has a high voltage.

The circuit arrangement shown in FIG. 2 functions as follows. In normal operation, the comparator 5 is in a low state, and a low voltage is output to the logic element 8. This remains the case, as long as the threshold value S of the second input E2 of the comparator 5 is not surpassed by the voltage on the anode of the diode 4, respectively on the first input E1 of the comparator 5. The threshold value S of the second input E2 is, of course, so predetermined that it is greater than the voltage, which is present on the first input E1 in normal operation. This specification can be assured, for example, by a matched selecting of the voltage source 6b or with the assistance of a voltage divider. In normal operation, the voltage on the first input E1 of the comparator 5 is limited by the conducting state voltage drop, same as in FIG. 1. The means that the filtered clock signal T, which lies on the first input E1 of the comparator 5, is always cut off, for example, at 0.7V.

In the case of overcurrent, the diode 4 blocks. The voltage, which lies on the anode of the diode 4, is no longer limited by the conducting state voltage drop of the diode 4, but, instead, determined by other circuit elements. Firstly, the voltage on the first input E1 depends on the filtered clock signal T. Comparator 5 further performs a comparison of the voltages on the first and second inputs E1, E2. If the diode 4 is blocking, the voltage on the first input E1 is identical with the filtered clock signal T from the filter element 7. Upon the first clock pulse present during an overcurrent state, the comparator 5 detects that the voltage on the first input E1 exceeds the threshold value S, respectively the voltage on the second input E2. As a result of this, the comparator 5 transfers from the low state to the high state, such that the output G1 of the comparator 5 immediately has a high voltage. Due to a feedback (not shown), the comparator 5 then also remains in the high state. The high voltage goes to an input E3 of the logic element 8. Due to this high voltage, the logic element 8 blocks the clock signal T coming from the microcontroller 9. As a result of this, the switch 3 is switched off, and the switch 3 as well as other components of the measuring device 11 are then protected against a too high electrical current.

The logic element 8 includes an output G3, which is connected with the microcontroller 9. FIG. 2 shows this path P2 referred to as "status short circuit". When an overcurrent state is present, the comparator 5 outputs a high voltage to the logic element 8. Via the "status short circuit" path P2 between the logic element 8 and the microcontroller 9, in the case an overcurrent state, a signal is transmitted from the logic element 8 to the microcontroller 9. Thereupon, the microcontroller 9 waits a predetermined number of clock pulses, before it outputs a signal via the "reset short circuit" path P9 to the first input E1 of the comparator 5. In the example of an embodiment illustrated in FIG. 2, this signal is output directly to a switch (not shown), preferably a field effect transistor. The switch (not shown) provides for a short time a path from the first input E1 of the comparator 5 to ground. When the first input E1 of the comparator 5 is switched to ground, the voltage on the first input E1 is pulled back below the threshold value S of the comparator 5. Then the output G1 of the comparator 5 has again a low voltage, and the logic element 8 lets the clock signal T pass through. If the overcurrent is still present, upon the following clock pulse $t_N$ on the switch 3, the diode 4 blocks again. As already described, the clock signal T is again blocked by the logic element 8.

This procedure can be described in three method steps. In step 1), the logic element 8 sends a "status short circuit" signal to the microcontroller 9. In step 2), the microcontroller 9 waits a predetermined number of clock pulses. In step 3) the microcontroller 9 outputs a "reset short circuit" signal to the first input E1 of the comparator 5.

If the above described method steps are performed at least once, preferably three times, then the microcontroller 9 no longer outputs a "reset short circuit" signal. Advantageous, in such case, is that the device can, in the case of a temporarily arising and correctable error, function further. If the microcontroller 9 no longer outputs a "reset short circuit" signal, the clock signal T is permanently switched off by means of the logic element 8. Preferably, then an error report is output by the microcontroller 9. For example, the microcontroller 9 can activate a red, light emitting diode (i.e. an "LED") via a circuit (not shown).

Figure 3:
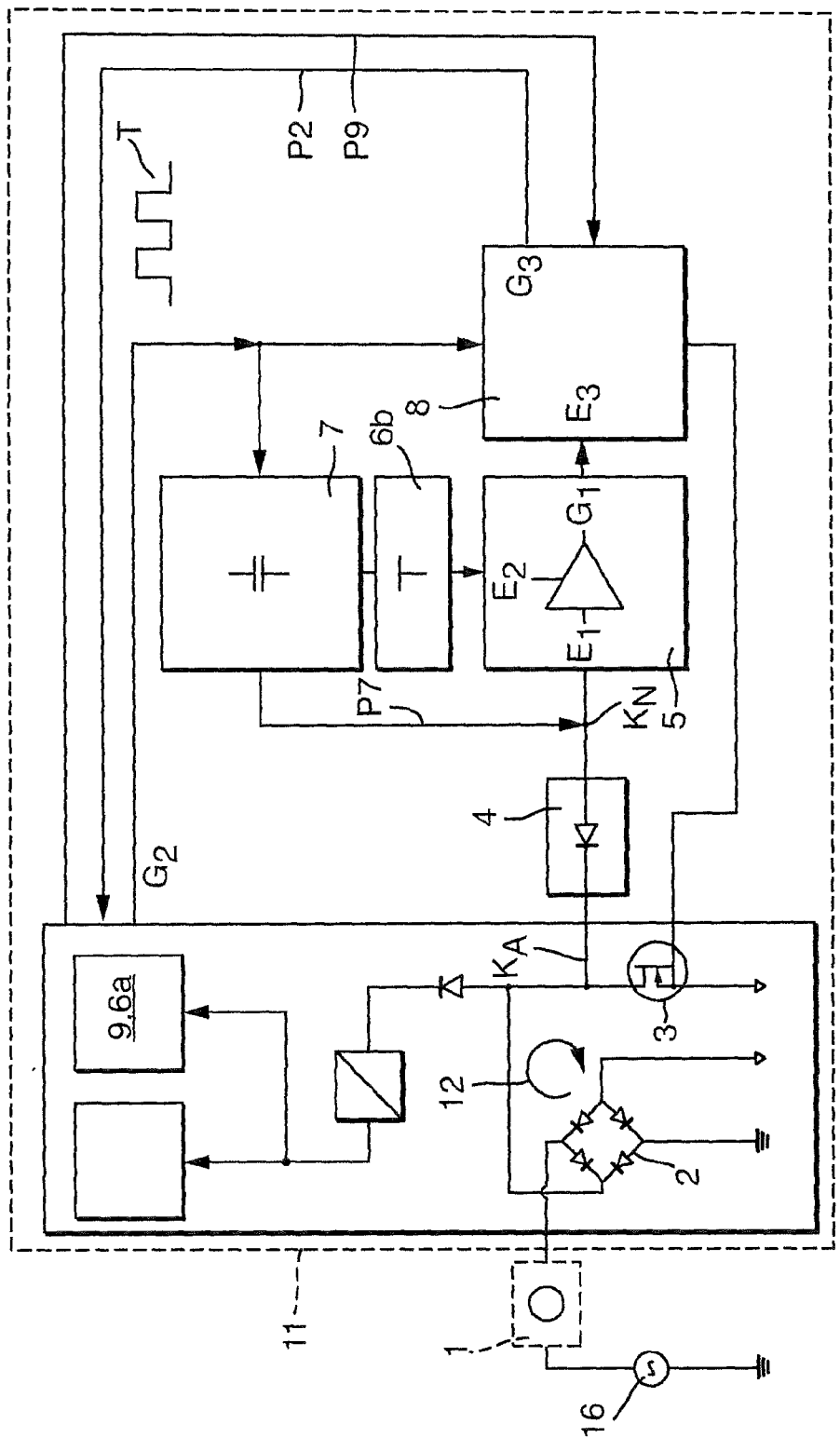
FIG. 3 is a block diagram of a third example of an embodiment of the circuit arrangement of the invention.

FIG. 3 shows a third example of an embodiment of the circuit arrangement of the invention in the form a block diagram. In contrast to the example of an embodiment illustrated in FIG. 2, in FIG. 3 the path P9 "reset short circuit" from the microcontroller 9 is connected to the logic element 8. In such case, a "reset" function is directly built into the logic element 8. For example, the "reset short circuit" path P9 can be connected to a monoflop (i.e. a monostable multivibrator) in the logic element 8.

The operation of the circuit arrangements illustrated in FIGS. 2 and 3 will now be described in greater detail based on the schematic representations of the clock signal T presented in FIGS. 4a-d, where the different signal forms of the clock signal T are shown for four different sampling locations A, B, C, D in the circuit arrangement as shown in FIG. 2.

At a point in time $T_0$, the circuit arrangement is in normal operation. FIG. 4a shows a representation of the voltage on the anode of the diode 4. The voltage on the anode of the diode 4 is limited by the conducting state voltage drop of the diode 4. The voltage on the anode of the diode is, consequently, prevented from exceeding a threshold value S, which is shown as a dashed line in FIG. 4.

FIG. 4b shows the filtered clock signal $T_F$, as output from the filter element 7. The filtered clock signal $T_F$ lies on the anode of the diode, where it is limited by the conducting state voltage drop of the diode 4.

The clock signal T provided by the microcontroller 9 is a rectangular pulse sequence and is shown in FIG. 4c. The logic element 8 can pass the clock signal T, so that the same signal goes to the switch 3. The signal, which arrives at the switch 3, is shown in FIG. 4d.

At a point in time $T_1$, an overcurrent state occurs in the DC circuit 12 illustrated in FIGS. 2 and 3. Diode 4 blocks. The filtered clock signal $T_F$ remains unchanged. This is shown in FIG. 4b.

FIG. 4a shows that the voltage, respectively signal form, on the anode of the diode 4 is then controlled by the filtered clock signal $T_F$. The voltage follows the signal form of the filtered clock signal $T_F$. The voltage exceeds the threshold value S of the comparator 5.

The clock signal T shown in FIG. 4c remains unchanged. As already described above, the clock signal T can no longer pass through the logic element 8. As shown in FIG. 4d, in this case, clock pulses are no longer present on the switch 3. Consequently electrical current no longer flows in the DC circuit 12, and the components of the circuit arrangement are protected against the overcurrent.

LIST OF REFERENCE CHARACTERS

1—burden
2—rectifier
3—switch
4—diode
5—comparator
6a, 6b—first voltage source, second voltage source
7—filter element
8—switch element/logic element
9—clock signal producer/microcontroller
10—switch element/normally closed switch
11—measuring device
12—DC circuit
13—gate
14—source
15—drain
16—AC/DC voltage source
$K_A$—cathode of the diode
$A/K_N/E_1$—sampling point/anode of the diode/first input of the comparator
$E_2$—second input of the comparator
$G_1/E_3$—output of the comparator/input of the logic element
$G_2$—output of the microcontroller
$G_3$—output of the logic element
$P_2$—status short-circuit path
$P_7$—path from the filter P₉—reset short circuit protection path
T—clock signal
T_F—filtered clock signal
T_N—clock pulse
B, C, D—sampling points
S—threshold value

The invention claimed is:

1. A circuit arrangement for the protection of at least one component of a two wire electrical current loop, which is connected in series with a burden to an AC/DC electrical current source, wherein the two wire electrical current loop has a rectifier, a clock signal producer, and a switch, wherein the rectifier forms a DC circuit, wherein the switch is connected in the DC circuit, and wherein the clock signal producer outputs a clock signal to the switch for clocking the DC circuit, the circuit arrangement comprising:
   a first voltage source;
   at least one switch element; and
   a diode, wherein:
   the conduction direction of said diode points from the anode of said diode to the cathode of said diode;
   said cathode of said diode is connected to the DC circuit;
   said anode of said diode is supplied with a periodic or constant voltage from said first voltage source;
   the voltage is at least periodically greater than a predetermined threshold value;
   said at least one switch element serves to turn the clock signal on or off; and
   said at least one switch element passes or blocks the clock signal as a function of the result of a comparison between the voltage which said anode of said diode has, and the threshold value.

2. The circuit arrangement as claimed in claim 1, wherein:
said first voltage source is embodied as a clock signal producer.

3. The circuit arrangement as claimed in claim 1, wherein:
said anode of said diode is connected to a first input of a comparator; and
an adjustable second voltage source is connected to a second input of said comparator.

4. The circuit arrangement as claimed in claim 3, wherein:
said adjustable second voltage source includes a voltage divider.

5. The circuit arrangement as claimed in claim 3, wherein:
an output of said comparator is connected with said at least one switch element; and
said at least one switch element is a logic element.

6. The circuit arrangement as claimed in claim 5, wherein:
an output of said logic element is connected with a microcontroller; and
said microcontroller detects based on an output signal of said logic element an overcurrent state in said DC circuit.

7. The circuit arrangement as claimed in claim 6, wherein:
a semiconductor switch is connected between said anode of said diode and ground; and
said microcontroller so controls the semiconductor switch that the voltage on said first input of said comparator lies for a short time below a threshold value.

8. The circuit arrangement as claimed in claim 3, wherein:
a feedback is provided between the output of said comparator and said first input of said comparator; and
said feedback has a feedback diode, which serves to keep the voltage on said first input of said comparator above the threshold value.

9. The circuit arrangement as claimed in claim 1, wherein:
said clock signal producer is integrated into said microcontroller or embodied as a separate microcontroller unit.

10. The circuit arrangement as claimed in claim 1, wherein:
said clock signal lies via a filter element on said anode of said diode.

* * * * *